United States Patent [19]

Minch

[11] 3,958,190
[45] May 18, 1976

[54] LOW HARMONIC CRYSTAL OSCILLATOR

[75] Inventor: Morris L. Minch, Coral Springs, Fla.

[73] Assignee: Motorola, Inc., Chicago, Ill.

[22] Filed: Mar. 31, 1975

[21] Appl. No.: 563,745

[52] U.S. Cl. ............................ 331/116 R; 331/159;
 311/177 V; 332/26; 332/30 V
[51] Int. Cl.² ...................... H03B 5/36; H03C 3/22
[58] Field of Search ............ 331/116 R, 159, 177 V;
 332/26, 30 V

[56] References Cited
UNITED STATES PATENTS

| | | |
|---|---|---|
| 2,745,010 | 5/1956 | Stansel ........................... 331/116 R |
| 3,832,653 | 8/1974 | Nugent et al. .................. 331/116 R |
| 3,845,410 | 10/1974 | Steel .............................. 331/116 R |

*Primary Examiner*—Siegfried H. Grimm
*Attorney, Agent, or Firm*—James W. Gillman; Eugene A. Parsons

[57] ABSTRACT

A colpitts oscillator having a tank circuit and a common base connected transistor, operating in a linear range, with an emitter-base junction coupled in the tank circuit and a load in the collector circuit thereof for passing current through the load at the frequency of the tank circuit.

1 Claim, 1 Drawing Figure

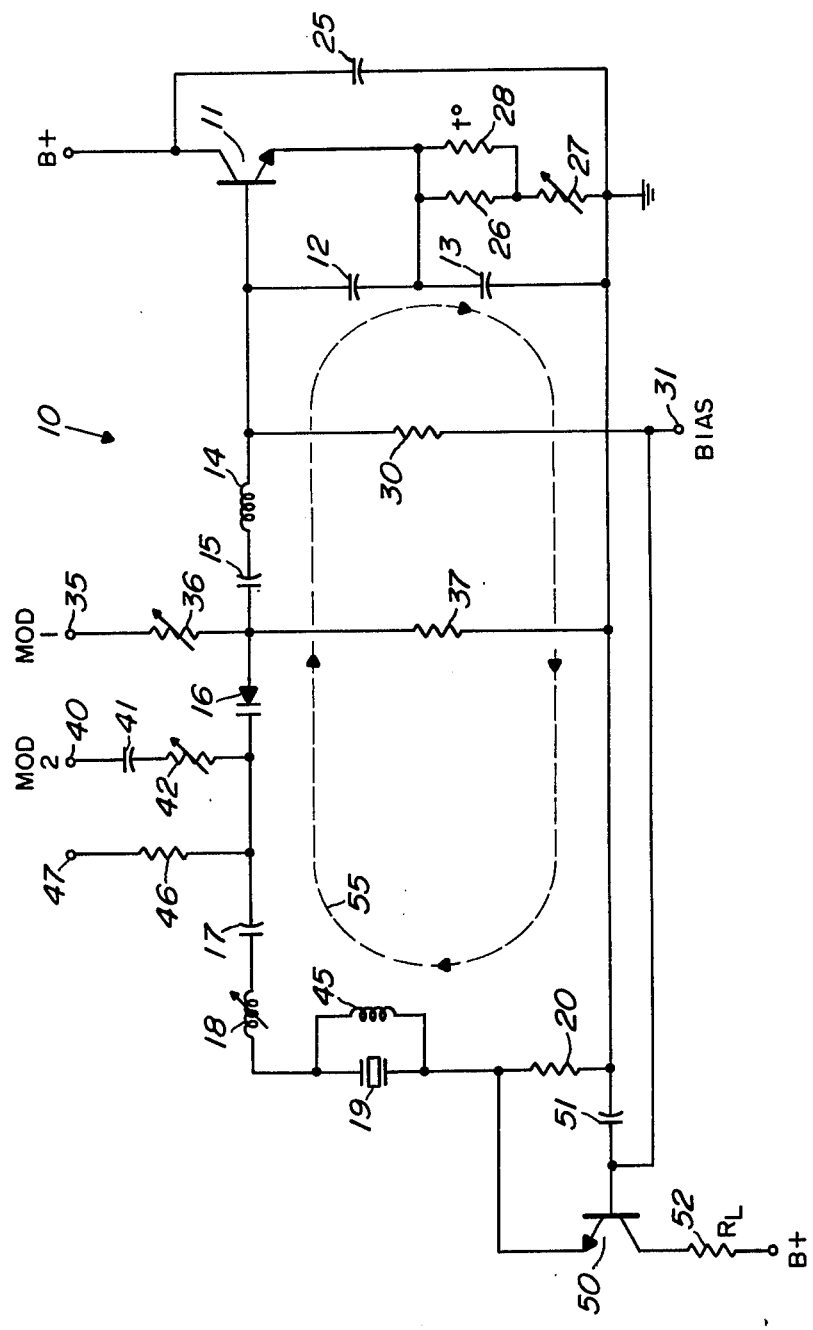

LOW HARMONIC CRYSTAL OSCILLATOR

BACKGROUND OF THE INVENTION

Crystal oscillators are utilized in many electronic circuits because of their superior stability. However, most crystal oscillators include an active element, such as a transistor, which operates in a non-linear range, such as class B or C amplification. This non-linear device or element introduces harmonics into the output of the oscillator which are very undesirable.

A crystal controlled colpitts oscillator is a typical example of a prior art oscillator wherein a tank circuit is connected to a transistor operating as a class B or C amplifier. The output of the oscillator is generally taken from the collector-emitter circuit of the transistor. Since the transistor is operating in a non-linear mode, harmonics are introduced into the output even though the tank circuit has a relatively pure fundamental frequency therein.

SUMMARY OF THE INVENTION

The present invention pertains to a low harmonic, crystal oscillator wherein an electronic tank circuit tuned to a predetermined frequency and including a crystal is connected to a transistor operating in a non-linear mode to provide oscillations and a common base connected transistor operating in a linear range or mode is coupled to the tank circuit for passing current circulating in the tank circuit at the predetermined frequency through the transistor and a load is connected to the transistor operating in the linear range so that current is passed through the load at the predetermined frequency.

It is an object of the present invention to provide a low harmonic, crystal oscillator.

It is a further object of the present invention to provide an oscillator with a tank circuit having only a predetermined frequency circulating therein and a linearly operating, common base connected transistor connected to the tank circuit and coupling a load thereto.

These and other objects of this invention will become apparent to those skilled in the art upon consideration of the accompanying specification, claims and drawing.

BRIEF DESCRIPTION OF THE DRAWING

The single FIGURE is a schematic view of a low harmonic, crystal oscillator embodying the present invention.

DESCRIPTION OF THE PREFERRED EMBODIMENT

In the FIGURE, the numeral 10 generally designates an oscillator including an active element, which in this embodiment is an npn type transistor 11, and a tank circuit including a pair of capacitors 12 and 13 connected in series between the base of transistor 11 and ground and an inductance 14, a capacitor 15, a voltage variable capacitor 16, a capacitor 17, a tunable inductance 18, a crystal 19, and a resistor 20 all connected in series between the base of transistor 11 and ground. The collector of the transistor 11 is connected directly to B+ and through a capacitor 25 to ground. The emitter of the transistor 11 is connected directly to the junction of the capacitors 12 and 13 and through a series connected fixed resistor 26 and variable resistor 27 to ground. A thermistor 28 is connected in parallel with the fixed resistor 26 and provides temperature compensation in the oscillator 10. A fixed resistor 30 is connected from the base of the transistor 11 to a terminal 31 having a source of bias (not shown) connected thereto. A first terminal 35, adapted to have a first modulating signal applied thereto, is connected to the junction of the capacitor 15 and voltage variable capacitor 16 by means of a variable resistor 36. A resistor 37 is connected between ground and the junction between capacitor 15 and voltage variable capacitor 16 for providing a DC return and a proper bias on the voltage variable capacitor 16.

A second terminal 40 is adapted to receive a second modulating signal and is connected to the junction of the voltage variable capacitor 16 and the capacitor 17 through a series connected coupling capacitor 41 and variable resistor 42. In the present embodiment the oscillator 10 is connected as an offset oscillator and identifying tones and/or audio may be supplied to terminals 35 and 40 to modulate the output of the oscillator 10. It should, of course, be understood that the oscillator 10 might be utilized without the modulating inputs and for applications other than an offset oscillator and all of the advantages disclosed herein would still be realized. A neutralizing inductance 45 is connected in parallel with the crystal 19 to compensate for the parallel capacitance inherent in the crystal 19. Many capacitance compensating schemes are well known in the art and the inductance 45 is illustrated as one simplified component. The junction of the voltage variable capacitor 16 and capacitor 17 is connected through a fixed resistor 46 to a terminal 47, adapted to have a suitable source of positive potential connected thereto. The terminal 47 may be the same terminal connected to the collector of the transistor 11 or it may be a supply which has greater regulation than the supply connected to the collector of the transistor 11.

An npn type transistor 50 has an emitter connected to the junction of the crystal 19 and the resistor 20 and a base connected directly to the bias terminal 31. The base of the transistor 50 is also connected through a bypass capacitor 51 to ground so that the transistor 50 is connected in a common base configuration. The collector of the transistor 50 is connected through a load 52 to a terminal designated B+, which may be the same terminal that is connected to the collector of transistor 11. The transistor 50 is biased in its linear mode or range of operation so that the collector current is an exact reproduction of the emitter current flowing therein.

In prior art oscillators of the type illustrated in the FIGURE, the output of the oscillator is taken from the collector of the transistor 11, for example. The transistor 11 is naturally driven into a non-linear mode of operation so that harmonics are introduced into the output thereof even though the circulating current in the tank circuit of the oscillator 10 is relatively free of harmonics. Thus, additional filtering or the like is required in these prior art circuits to provide a purer sinusoidal output from the oscillator. The additional filtering or other techniques to remove the harmonics from the oscillator output add additional expense and complication to the circuit.

In the operation of the present circuit, the circulating current, represented by the dotted line designated 55, in the tank circuit of the oscillator 10 is oscillating at a relatively pure predetermined frequency, for example the fundamental frequency of the oscillator 10. Since the transistor 50 is connected in a common base configuration, the input impedance presented to the tank circuit of the oscillator 10 is low and, therefore, provides very little loading on the oscillator 10. The crystal 19 acts as a very narrow bandpass filter and applies the currents of the tank circuit, which are circulating at the predetermined frequency, to the emitter of the transistor 50. Since the transistor 50 is operating in its linear range or mode, the collector current flowing therein is an exact reproduction of the emitter current. Thus, the current flowing in the load 52 is at the predetermined frequency of the oscillator 10 and has little or no harmonic components therein. The inductance 18 provides additional filtering in the tank of the oscillator 10 and the neutralizing inductance 45 further improves the filtering by eliminating the shunting effect of the crystals parallel capacitance, as is well known in the art.

Thus, a low harmonic, crystal oscillator is disclosed which provides a relatively harmonic free output from a crystal oscillator, such as a colpitts oscillator or the like. While the load 52 is illustrated as a resistor $R_L$, it should be understood that substantially any electrical components might be utilized in the output circuit as the current sampling device or devices as will be realized by those skilled in the art. Further, while the present circuit is operating at the fundamental frequency of the oscillator 10, it should be understood that the circuit can be operated in either fundamental or overtone modes and is useful from low frequency to very high frequency ranges.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:
1. A low harmonic, crystal oscillator comprising:
   a. an electronic tank circuit tuned to a predetermined frequency and including an inductance, a plurality of capacitors and a crystal;
   b. a transistor connected to said tank circuit to form a colpitts type oscillator; and
   c. a common base transistor circuit connected to operate in a linear range and including a transistor with an emitter-base junction forming a portion of said tank circuit and a collector adapted to have a load connected thereto for passing current therethrough at the predetermined frequency.

* * * * *